US010157767B2

(12) United States Patent
Lee

(10) Patent No.: US 10,157,767 B2
(45) Date of Patent: Dec. 18, 2018

(54) APPARATUS FOR PICKING SEMICONDUCTOR DEVICES

(71) Applicant: Samsung Electronics Co., Ltd., Suwon-si (KR)

(72) Inventor: Jong-An Lee, Asan-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/792,826

(22) Filed: Oct. 25, 2017

(65) Prior Publication Data

US 2018/0122682 A1 May 3, 2018

(30) Foreign Application Priority Data

Nov. 2, 2016 (KR) .................. 10-2016-0145408

(51) Int. Cl.
| | |
|---|---|
| B25J 15/06 | (2006.01) |
| B65G 47/91 | (2006.01) |
| H01L 21/683 | (2006.01) |
| H05K 13/04 | (2006.01) |
| H01L 21/67 | (2006.01) |

(52) U.S. Cl.
CPC ...... *H01L 21/6838* (2013.01); *B25J 15/0616* (2013.01); *B65G 47/911* (2013.01); *B65G 47/918* (2013.01); *H01L 21/67144* (2013.01); *H05K 13/0408* (2013.01)

(58) Field of Classification Search
CPC .. B25J 15/0616; B66C 1/0237; B66C 1/0243; B66C 1/0256; H01L 21/6838; H01L 21/6835; H01L 2221/68313; H01L 2221/68322; H05K 13/0408; G01R 31/2893; B65G 47/91; B65G 47/911; B65G 47/912; B65G 47/917; B65G 47/918
USPC .................................... 294/183, 185
See application file for complete search history.

(56) References Cited

U.S. PATENT DOCUMENTS

| | | | | |
|---|---|---|---|---|
| 3,973,682 A * | 8/1976 | Neff | ..................... | H01L 21/6838 294/186 |
| 4,657,470 A * | 4/1987 | Clarke | ................... | B25J 9/1015 29/429 |
| 5,029,383 A * | 7/1991 | Snyder | ............... | H05K 13/0408 29/740 |
| 5,059,088 A * | 10/1991 | Klein | ..................... | B65G 47/91 294/186 |

(Continued)

FOREIGN PATENT DOCUMENTS

| | | |
|---|---|---|
| KR | 0197286 | 9/2000 |
| KR | 0454763 | 11/2004 |

(Continued)

*Primary Examiner* — Dean J Kramer
(74) *Attorney, Agent, or Firm* — Muir Patent Law, PLLC

(57) ABSTRACT

An apparatus for picking up one or more semiconductor devices includes a body having an air chamber that communicates with surroundings outside of the body and at least a first supply line through which compressed air is supplied into the air chamber, a pickup cylinder penetrating through the body and movably installed in the body, a suction pad being provided at an end portion of the pickup cylinder, and a power transformer secured to the pickup cylinder and transforming an air pressure of the air chamber to a driving force for driving the pickup cylinder.

17 Claims, 5 Drawing Sheets

(56) References Cited

U.S. PATENT DOCUMENTS

| | | | |
|---|---|---|---|
| 5,290,134 A | 3/1994 | Baba | |
| 5,308,132 A * | 5/1994 | Kirby | B25J 9/1633 |
| | | | 29/743 |
| 5,794,329 A * | 8/1998 | Rossmeisl | H05K 13/0069 |
| | | | 29/703 |
| 6,328,362 B1 * | 12/2001 | Isogai | H05K 13/0408 |
| | | | 29/740 |
| 6,346,682 B2 | 2/2002 | Kim et al. | |
| 6,467,824 B2 * | 10/2002 | Bolotin | H01L 21/6838 |
| | | | 29/743 |
| 6,592,325 B2 * | 7/2003 | Lu | H01L 21/67271 |
| | | | 414/225.01 |
| 6,915,561 B2 | 7/2005 | Yokohama et al. | |
| 7,426,781 B2 * | 9/2008 | Burger | H05K 13/0408 |
| | | | 29/740 |
| 7,486,094 B2 | 2/2009 | Chyan | |
| 2014/0352526 A1 * | 12/2014 | Kusaka | F16J 10/02 |
| | | | 92/169.3 |

FOREIGN PATENT DOCUMENTS

| KR | 0840271 | 6/2008 |
|---|---|---|
| KR | 0960606 | 6/2010 |

\* cited by examiner

APPARATUS FOR PICKING SEMICONDUCTOR DEVICES

CROSS-REFERENCE TO RELATED APPLICATIONS

This application claims priority under 35 U.S.C § 119 to Korean Patent Application No. 10-2016-0145408 filed on Nov. 2, 2016 in the Korean Intellectual Property Office, the contents of which are incorporated by reference herein in their entirety.

BACKGROUND

1. Field

An example embodiment relates to an apparatus for picking semiconductor devices and method of picking semiconductor devices using the same, and more particularly, to a picking apparatus for picking semiconductor devices by vacuum sucking and a method using this picking apparatus.

2. Description of the Related Art

A picker assembly has been widely used in semiconductor industries for picking and sorting semiconductor chips and packages. For example, the picker assembly picks up the semiconductor chips from a chip carrier and transfers the picked chips to a circuit board for a packaging process. In addition, the picker assembly also picks up the semiconductor package and transfers the picked semiconductor packages into a test tray for an electrical test process using a test handler or a recovery tray according to the test results.

In a conventional picker apparatus, the semiconductor chips in the chip carrier or the semiconductor device in a customer tray for the test handler are individually picked up and are transferred into the circuit board or the test tray of the test handler by the picker assembly. In such a case, since the arrangements of the chips or the packages in the chip carrier and the customer tray are generally different from those of the circuit board and the test tray, the configurations of the picker assembly are firstly adjusted or controlled in accordance with the arrangements of the target to/from which the picker assembly is conducted. Then, the picker assembly moves downwards for picking up the chips or the packages or mounting/inserting the picked chips or the packages.

When the picker assembly reaches the semiconductor chips or devices in picking or inserting/mounting, an overload may be applied to some of the chips by the picker assembly and may cause unexpected damages to the chips. For example, since the picker assembly moves downwards for picking or inserting/mounting the chips, an uneven level of the tray may usually cause the overload to the chips that is arranged at a relatively higher position in the tray. Thus, the overload to some of the chips in the tray usually causes the chip damage and deteriorates the yield of semiconductor devices.

SUMMARY

Example embodiments of the present inventive concept provide a picker assembly having an air cushion for absorbing the overloads to the chips, to thereby prevent the chip damage caused by the overload.

Other example embodiments of the present inventive concept provide an apparatus for picking semiconductor devices having the above picker assembly.

Other example embodiments provide a method using the apparatus and picker assembly for picking semiconductor devices and manufacturing semiconductor devices.

According to exemplary embodiments of the inventive concept, an apparatus for picking up one or more semiconductor devices includes a body having an air chamber that communicates with surroundings outside of the body and at least a first supply line through which compressed air is supplied into the air chamber, a pickup cylinder penetrating through the body and movably installed in the body such that a suction pad may be provided at an end portion of the pickup cylinder, and a power transformer secured to the pickup cylinder and transforming an air pressure of the air chamber to a driving force for driving the pickup cylinder.

According to exemplary embodiments of the inventive concept, an apparatus for picking up one or more semiconductor devices includes a body having an air chamber in fluid communication with surroundings outside the body and in fluid communication with a compressed air supplier that is connected to the air chamber through at least a first supply line, a pickup cylinder penetrating through the body and movably installed in the body in such a configuration that a first end portion is for connecting to a vacuum pressure generator and a second end portion opposite to the first end portion includes a suction pad to which semiconductor devices are suctioned and adhered, and a power transformer secured to the pickup cylinder and transforming an air pressure of the air chamber to a driving force for driving the pickup cylinder.

According to exemplary embodiments of the inventive concept an apparatus for picking up semiconductor devices includes a base plate having a common air line through which a compressed air is supplied and a plurality of branch air lines that branch from the common air line, a pneumatic center for controlling the air flow of the compressed air to the common air line, a plurality of picker assemblies mounted on or in the base plate and connected to the branch air lines, respectively, a vacuum pressure generator that applies a vacuum pressure for suctioning the semiconductor devices to each of the picker assemblies. Each picker assembly may include a body having an air chamber that communicates with surroundings outside the picker assembly and an air supply line that is connected to a respective branch air line and supplies compressed air to the air chamber, a pickup cylinder penetrating through the body and movably installed in the body in such a configuration that a first end portion of the pickup cylinder is connected to the vacuum pressure generator and a second end portion of the pickup cylinder opposite to the first end portion includes a suction pad to which semiconductor devices are suctioned and adhered, and a power transformer secured to the pickup cylinder and transforming an air pressure of the air chamber to a driving force for driving the pickup cylinder.

According to exemplary embodiments of the inventive concept, method of manufacturing a semiconductor device includes supplying compressed air to a first picker assembly having a pickup cylinder disposed in a housing including an air chamber separated into a first air chamber compartment and a second air chamber compartment, picking up a semiconductor device using the pickup cylinder, and during picking up of the semiconductor device, releasing air from the air chamber to the outside of the first picker assembly through one or more air discharge lines.

According to example embodiments of the present inventive concept, an air chamber may be provided as an open system in the body that may function as an operation base of the pickup cylinder of the picker assembly and the compressed air may be filled into the air chamber in such a way that the compressed air may be under a dynamic equilibrium state in the air chamber. When the overload is applied to the pickup cylinder, the dynamic equilibrium of the compressed air may be broken and the compressed air may be discharged outwards until the dynamic equilibrium of the compressed air may be recovered in the air chamber. Therefore, a minute overload may be sufficiently absorbed into the compressed air in the air chamber, so that the damages to the semiconductor chips caused by the overload may be prevented when picking up the semiconductor chips by using the picker assembly.

Particularly, the chip damage caused by a minute and fine overload to the pickup cylinder of the picker assembly may more frequently occur according to the thickness of the semiconductor chip decreasing and the integration degree of the semiconductor chips increasing. Since the pickup cylinder and the power transformer of the picker assembly may float in the compressed air of the air chamber, a minute overload slightly larger than the inertia of the floated pickup cylinder and the power transformer may be sufficient for breaking the dynamic equilibrium in the air chamber. Thus, the overload may be sufficiently absorbed into the compressed air in the air chamber much more sensitively than the overload may be absorbed by a mechanical absorber of a conventional picker assembly. Therefore, damage to the semiconductor chips caused by the overload may be reduced or prevented when picking up the semiconductor chips by using the picker assembly.

BRIEF DESCRIPTION OF THE DRAWINGS

These and other features of the present disclosure will become more apparent by describing in detail exemplary embodiments thereof with reference to the accompanying drawings of which.

DETAILED DESCRIPTION

Figure 1:
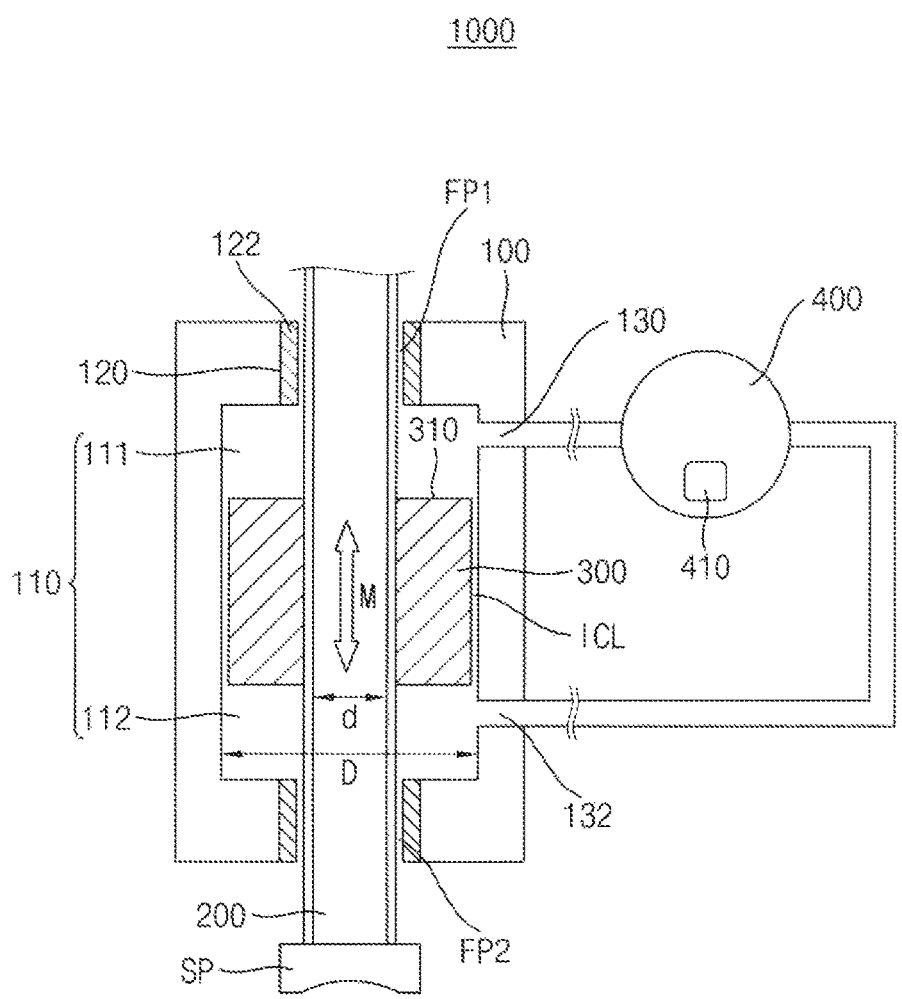
FIG. 1 is a cross-sectional view illustrating a picker assembly apparatus in accordance with an example embodiment.

Reference will now be made to example embodiments, which are illustrated in the accompanying drawings, wherein like reference numerals may refer to like components throughout.

Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

FIG. 1 is a cross-sectional view illustrating a picker assembly apparatus in accordance with an example embodiment.

Referring to FIG. 1, a picker assembly 1000 in accordance with an example embodiment may include a body 100 having an air chamber 110 that communicates with surroundings and at least a supply line through which an compressed air may be supplied into the air chamber 110, a pickup cylinder 200 penetrating through the body 100 and movably installed in the body 100, a power transformer 300 secured to the pickup cylinder 200 and transforming an air pressure of the air chamber 110 to a driving force for driving the pickup cylinder 200 and a pneumatic source 400 that may be connected to the supply line and may generate the compressed air. The term "air" as discussed herein, may refer to atmospheric air, or other gases that may be present, for example, around the picker assembly, during a manufacturing process. In addition, the gases included in the compressed air need not have the same composition as the air surrounding the picker assembly.

In one embodiment, the body 100 may serve as a frame of the picker assembly 1000 and may be formed into a three-dimensional shape having a sufficient strength and stiffness. For example, the body 100 may include a slender cylinder comprising steel. Particularly, a pair of joint holes 120 may be provided at upper and lower end portions of the body 100.

The body 100 may support the pickup cylinder 200 when picking up the semiconductor devices and thus may function as an operation base for the pickup cylinder 200 in picking and inserting/mounting the semiconductor devices. While the present example embodiment discloses that the body 100 may be shaped into the steel cylinder, any material and shapes would be allowable for the body 100 as long as the body 100 may function as the operation base, and thus may form a housing, for the pickup cylinder 200.

Particularly, the air chamber 110 may be provided at an inside of the body 100 and may be filled with a compressed air that may be supplied through the first and second supply lines 130 and 132. The first and the second supply lines 130 and 132, also described as air supply lines, may be connected to an external pneumatic source 400. The body 100 and the pickup cylinder 200 may be combined in such a way that the pickup cylinder 200 penetrates through the air chamber 110 and may move upwards and downwards along a vertical direction of the body 100.

For example, the air chamber 110 may be provided as an inner cavity that may be arranged at a central portion of the body 100 and have a width in a horizontal direction, or diameter, larger than that of the pickup cylinder 200. The air chamber 110 may be in fluid communication with the joint holes 120. For example, the air chamber 110 may be arranged at the central portion of the body 100 and the joint holes 120 may be arranged at the upper and lower portions of the body 100 in such a way that the diameter of the air chamber 110 may be significantly larger than those of the joint holes 120. The pickup cylinder 200 may penetrate through the air chamber 110 and may be movably installed to the body 100 at the upper and lower joint holes 120.

In the present example embodiment, the air chamber 110 and the joint holes 120 may be arranged in a central axis of the cylindrical body 100, so a lower joint hole, the air chamber and an upper joint hole may be arranged in series along the central axis of the cylindrical body 100. There may be a gap (e.g., an air gap) between inner sidewalls of the body 100 at the joint holes 120 and an outer wall or surface of the pickup cylinder 200. The gap may allow the air chamber 110 to be in fluid communication with an external environment outside the air chamber 110 and body 100.

Since the pickup cylinder 200 may penetrate through the air chamber 110 and the joint holes 120, the central axis of the pickup cylinder 200 may substantially coincide with the central axis of the cylindrical body 100.

A driving force for moving the pickup cylinder 200 may be determined by the volume of the air chamber 110, the air pressure of the compressed air in the air chamber 110 and the size of the power transformer 300. Thus, the sizes of the air chamber 110 (e.g., its volume) and the power transformer 300 may affect the driving force of the pickup cylinder 200. Particularly, the diameter D of the air chamber 110 combined with the air pressure of the compressed air and the size and shape of the power transformer 300 may affect the driving force of the pickup cylinder 200. In the present example embodiment, the diameter D of the air chamber 110 may be about 1.5 times to about 5 times of the diameter d of the pickup cylinder 200.

The joint holes 120 may be arranged at upper and lower end portions of the body 100 and may be in fluid communication with the air chamber 110. A bearing 122 (e.g., bushing, also described as a bushing-type bearing; or a thrust bearing) may be provided with the joint hole 120 and the pickup cylinder 200 may be secured to the bearing 122, so that the pickup cylinder 200 may be movably installed to the body 100 in such a way that the pickup cylinder 200 may be secured to the body 100 in a radial direction thereof (e.g., it does not rotate radially) and may move along a longitudinal direction thereof. The bearing 122 may be positioned between the inner sidewall of the body 100 at the joint holes 120 and an outer wall or surface of the pickup cylinder 200.

In the present example embodiment, the bearing 122 may be exemplarily provided with the joint holes 120 to allow the pickup cylinder 200 to move along the longitudinal direction and may be constrained along the radial direction (e.g., rotation). Thus, various bushing-type bearings or thrust bearings may be used with the joint holes 120 according to the joint characteristics of the pickup cylinder 200 in the joint holes 120.

Particularly, a maximal allowable tolerance may be intentionally provided between the bearing 122 and the pickup cylinder 200, so that air discharge lines may be arranged at the upper and lower portions of the body 100. Thus, the air chamber 110 may be in fluid communication with the surroundings through the air discharge lines. For example, a first air discharge line FP1 may be arranged between the pickup cylinder 200 and the bearing 122 at the upper portion of the body 100 and a second air discharge line FP2 may be arranged between the pickup cylinder 200 and the bearing 122 at the lower portion of the body 100. Therefore, the air chamber 110 may be formed into an open system that may be in fluid communication with the surroundings, and the compressed air in the air chamber 110 may be under a dynamic equilibrium state in which the inflow and outflow of the compressed air may be under equilibrium state at a predetermined air pressure. In one embodiment, the first air discharge line FP1 and second air discharge line FP2 comprise air gaps surrounding the entire circumference of the pickup cylinder 200, and are formed between the outer surface of the pickup cylinder 200 and the bearings 122. In another embodiment, the first air discharge line FP1 and second air discharge line FP2 comprise air gaps formed only at certain locations around the circumference of the pickup cylinder 200 (e.g., arranged radially around the pickup cylinder 200), such that at certain portions, the bearing 122 contacts the outer surface of the pickup cylinder 200, and at other portions, an air gap is formed between the outer surface of the pickup cylinder 200 and an inner surface of the bearing 122.

The pickup cylinder 200 may be shaped into a slender cylinder penetrating through the body 100. For example, the pickup cylinder 200 may include a hollow shaft having the diameter d smaller than that of the air chamber 110. A vacuum pressure may be applied to an inner space of the hollow shaft of the pickup cylinder 200.

A lower portion of the pickup cylinder 200 may protrude from the lower portion of the body 100 and a suction pad SP may be provided at the lower portion of the pickup cylinder 200. An upper portion of the pickup cylinder 200 may protrude from the upper portion of the body 100 and a vacuum line (not shown) may be connected to the upper portion of the pickup cylinder 200. The vacuum pressure may be applied to the inner space of the pickup cylinder 200 and the semiconductor devices may be suctioned and secured to the suction pad SP at the bottom end of the pickup cylinder 200 by the vacuum pressure.

Particularly, since the pickup cylinder 200 may be movably installed in the body 100 in the longitudinal direction (i.e., the vertical direction of the body 100), the contact load between the semiconductor device and the suction pad SP may be reduced by the movement of the pickup cylinder 200, as described in detail hereinafter.

The power transformer 300 may be secured to the pickup cylinder 200 and may transform the air pressure in the air chamber 110 to the driving force for moving the pickup cylinder 200.

The power transformer 300 may include, for example, a pressure face 310 to which the driving force may be applied and of which the plane vector may be parallel with the longitudinal direction of the pickup cylinder 200. Thus, the air pressure in the air chamber 110 may be transformed into the driving force that may be applied in the longitudinal direction of the pickup cylinder 200 and may be proportional to the surface area of the pressure face 310. For example, the power transformer 300 may have two pressure faces, also described as a top surface and bottom surface. Each surface may be flat, according to one embodiment, and may be positioned so that air from the first supply line 130 exerts a pressure on the top surface and/or air from the second supply line 132 exerts a pressure on the bottom surface, in order to force the power transformer 300 and pickup cylinder 200 up or down.

In the present example embodiment, the power transformer 300 and the pickup cylinder 200 may be integrally formed into one body, so the driving force that may be applied to the power transformer 300 may drive the pickup cylinder 200 to move in the longitudinal direction.

For example, the power transformer 300 may be shaped into a separation plate enclosing the pickup cylinder 200 and corresponding to a surface profile of an inner sidewall of the air chamber 110. Thus, the air chamber 110 may be separated into first chamber 111 (also described as first air chamber or first air chamber compartment of air chamber 110) and second chamber 112 (also described as second air chamber or second air chamber compartment of air chamber 110) by the separation plate of the power transform 300. For example, the separation plate may have a disk-like shape from an overhead view, and may have a thickness in a vertical direction from a top surface to a bottom surface.

In the present example embodiment, the power transformer 300 may be shaped into a hollow disk corresponding to a surface profile of an inner sidewall of the air chamber 110 and having a predetermined thickness (e.g., in a vertical direction). Particularly, the pickup cylinder 200 may penetrate through a central portion of the hollow disk in such a way that the pickup cylinder 200 and the power transformer 300 may coincide with the same central axis. In one embodiment, the power transformer 300 has a donut shape that surrounds the pickup cylinder 200 and is fixedly attached to the pickup cylinder 200, and may be described as a donut-shaped cylinder.

The hollow disk may have a thickness (e.g., in a vertical direction) smaller than a height of the air chamber 110, and may be spaced apart from the inner sidewall of the air chamber 110 in such a way that an inter-chamber air line ICL (also described as an inter-chamber air channel) may be provided with the air chamber 110. For example, an outer diameter of the power transformer 300 may be smaller than a diameter of the inner sidewall of the air chamber 110. The compressed air in the air chamber 110 may mutually flow between the first and the second chambers 111 and 112 through the inter-chamber air line ICL, which may be a gap between the inner sidewall of the air chamber 110 and the outer circumference of the power transformer 300.

The inter-chamber air line ICL may have a width or a diameter corresponding to a gap distance between the hollow disk of the power transformer 300 and the inner sidewall of the air chamber 110. Particularly, the width of the inter-chamber air line ICL may be determined in view of an absorption time of the overload that may be applied to the pickup cylinder 200. Since the picker assembly 1000 may be mainly used in the packaging process for picking and mounting the semiconductor chips or in the test process for picking and inserting the semiconductor packages, the width or the diameter of the inter-chamber air line ICL may be in a range of about 5 μm to about 20 μm.

Particularly, the inter-chamber air line ICL may have the same size as first and second penetration paths PP1 ad PP2 of the body 100, which will be described in detail hereinafter, so the interflow between the first and the second chambers 111 and 112 in the air chamber 110 may be the same as the discharge flow through the first and second penetration paths PP1 and PP2.

When the overload to the pickup cylinder 200 and the absorption time of the overload increases, the width of the inter-chamber air line ICL may be reduced or increased according to the overload and the absorption time.

The unexpected overload to the pickup cylinder 200 by the suction pad SP may be reduced and absorbed by the compressed air in the second chamber 112 and the compressed air in the second chamber 112 may partially flow upwards to the first chamber 111 through the inter-chamber air line ICL. For example, the overload may be gradually taken into the air chamber 110 through the inter-chamber air line ICL and the compressed air in the air chamber 110 may be discharged outwards through the first and the second discharge air lines FP1 and FP2. Accordingly, the overload applied to the pickup cylinder 200 may be gradually absorbed by the compressed air in the air chamber 110 and the damage to the semiconductor device caused by the overload may be sufficiently prevented in the picker assembly 1000.

Particularly, the compressed air may be discharged from the air chamber 110 during the absorption time in response to the overload that may be unexpectedly applied to the pickup cylinder 200, thereby sufficiently preventing an absorption shock to the semiconductor device.

For example, the pneumatic source 400 may include an air tank (not shown), a control valve (not shown) that may be arranged on the first and second supply lines 130 and 132 and may control the air flow into the air chamber 110 from the air tank, a pressure detector (not shown) detecting the air pressure in the air chamber 110 and a pneumatic controller 410 for maintaining an air pressure in the air chamber to be uniform. For example, the pneumatic controller 410 may keep the air pressure in the air chamber 110 to be uniform in a range of about 0.5 bar to about 1.5 bar.

The compressed air generated in the pneumatic source 400 may be supplied into the air chamber 110 through the first and the second supply lines 130 and 132. The pneumatic controller 410 may change the moving direction of the pickup cylinder 200 by changing the air pressure of the first and the second chambers 111 and 112. For example, the pneumatic controller 410 may individually control a mass flow of the compressed air to the first and the second chambers 111 and 112 by using the control valve and the pickup cylinder 200 may move according to the pressure difference between the first and the second chambers 111 and 112. For example, when the pneumatic controller 410 causes more compressed air to flow into the first chamber 111 than the second chamber 112, the pickup cylinder 200 may move downwards due to the pressure difference between the first and the second chambers 111 and 112.

When the compressed air flows into the air chamber 110, the amount of the inflow of the compressed air through the supply lines 130 and 132 may be greater than that of the outflow of the compressed air through the first the second air discharge lines FP1 and FP2. Thus, the air pressure in the air chamber 110 may increase higher than the surroundings by the inflow of the compressed air, thereby generating the driving force for moving upwards or downwards the pickup cylinder 200 in the air chamber 110.

When picking up the semiconductor device, the pneumatic controller 410 may control the control valve in such a way that the amount of the inflow of the compressed air in to the air chamber 110 may be the same as the amount of the outflow of the compressed air from the air chamber 110 and thus the compressed air may be under a dynamic equilibrium state in the air chamber 110.

In such a case, when the dynamic equilibrium state in the air chamber 110 is broken by an overload that may be applied to the pickup cylinder 200 and the amount of the inflow of the compressed air is maintained as a constant by the pneumatic controller 410, the compressed air in the air chamber 110 may be discharged outwards through the first and the second air discharge lines FP1 and FP2 until the dynamic equilibrium state is recovered in the air chamber 110.

Therefore, the overload to the pickup cylinder 200 may be absorbed or taken into the compressed air in the air chamber 110 and may be prevented from being applied to the semiconductor device, which may reduce or minimize the damage to the semiconductor device due to the overload.

Since the pickup cylinder 200 and the power transformer 300 may float in the compressed air, a minute external force slightly larger than the inertia of the floated pickup cylinder 200 and the power transformer 300 may be sufficient for breaking the dynamic equilibrium in the air chamber 110. Thus, the overload to the pickup cylinder 200 may be absorbed into the compressed air in the air chamber 110 much more sensitively than the overload may be absorbed by a mechanical absorber of the conventional picker assembly. In the present example embodiment, such small load changes of about 20 gf to about 25 gf (where "g" is grams and "f" is gravitational acceleration) may be sufficiently absorbed or taken into the compressed air of the air chamber 110, so that the semiconductor device may be protected from such a small overload in a range of about 20 gf to about 25 gf.

In one example embodiment, the pneumatic source 400 may include an air regulator which may regulate the air pressure of the air chamber 110 in a range of about 0.1 kgf/cm$^2$ to about 0.3 kgf/cm$^2$ (where "f" is gravitational acceleration).

While the present example embodiment discloses that the pickup cylinder moves downwards and upwards just by controlling the amount of the inflow to the first and the second chambers 111 and 112, respectively, an additional driver for driving the pickup cylinder 200 may be provided with the picker assembly 1000.

For example, a driving cylinder may be additionally provided with the picker assembly 1000 in such a way that the driving cylinder may be connected to the pickup cylinder 200 by a mechanical linking system. In such a case, the pickup cylinder 200 may move upwards and downwards according to the movement of the driving cylinder. In such a case, the air pressure of the air chamber 110 may be controlled by the pneumatic source 400 and the movement of the pickup cylinder 200 may be controlled by the driving cylinder.

The above picker assembly 1000 may be operated as follows. The compressed air may flow into one of the first and the second chambers 111 and 112 and thus the pickup cylinder 200 may move downwards or upwards according to the inflow of the compressed air. In such a case, the amount of the inflow of the compressed air into the air chamber 110 may be controlled to be greater than the amount of the outflow of the compressed air from the air chamber 110 so as to generate the driving force for driving the pickup cylinder 200.

For example, when the pickup cylinder 200 moves downwards to a pick position of a chip carrier for picking up the semiconductor chip from the chip carrier, the amount of the inflow of the compressed air into the air chamber 110 may be controlled to be the same as the amount of the outflow of the compressed air from the air chamber 110 and thus the compressed air may be under a dynamic equilibrium state in the air chamber 110. Then, the inner space of the pickup cylinder 200 may be formed into a substantially vacuum state under a vacuum pressure in such a way that the semiconductor chip may be suctioned and adhered to the suction pad SP.

When the pickup cylinder 200 moves downwards for picking up the semiconductor chips from the chip carrier, an overload may be applied to the suction pad SP due to various defects such as a flatness defect of the chip carrier. In such a case, the overload may be absorbed or taken into the compressed air of the air chamber 110 and the dynamic equilibrium state may be broken in the air chamber 110. Then, the compressed air in the air chamber 110 may be discharged outwards through the first and the second air discharge lines FP1 and FP2 until the dynamic equilibrium state is recovered in the air chamber 110. Therefore, the compressed air in the air chamber 110 may function as a shock absorber for absorbing the overload that may be unexpectedly applied to the pickup cylinder 200.

Therefore, the overload to the pickup cylinder 200 may be absorbed or taken into the compressed air in the air chamber 110 and may be prevented from being applied to the semiconductor device, which may reduce or minimize the damages to the semiconductor device due to the overload.

Since the discharge speed of the compressed air may be determined by a cross sectional area of the first and the second air discharge lines FP1 and FP2 (e.g., as viewed from a plan view), the absorption time or a response time of the overload may be significantly determined by the cross sectional area of the first and the second air discharge lines FP1 and FP2. Thus, the cross sectional area of the first and the second air discharge lines FP1 and FP2 may be selected according to the maximal overload to the pickup cylinder 200 and the absorption time or the response time of the overload.

When the cross sectional area of the first and the second air discharge lines FP1 and FP2 are of a size large enough to exceed the maximal allowable tolerance of the pickup cylinder 200 in the joint holes 120 in view of the overload and the response time, an additional discharge line may be provided with the picker assembly 1000. The additional discharge line may be provided with the body 100 or as an additional element separated from the body 100.

Figure 2:
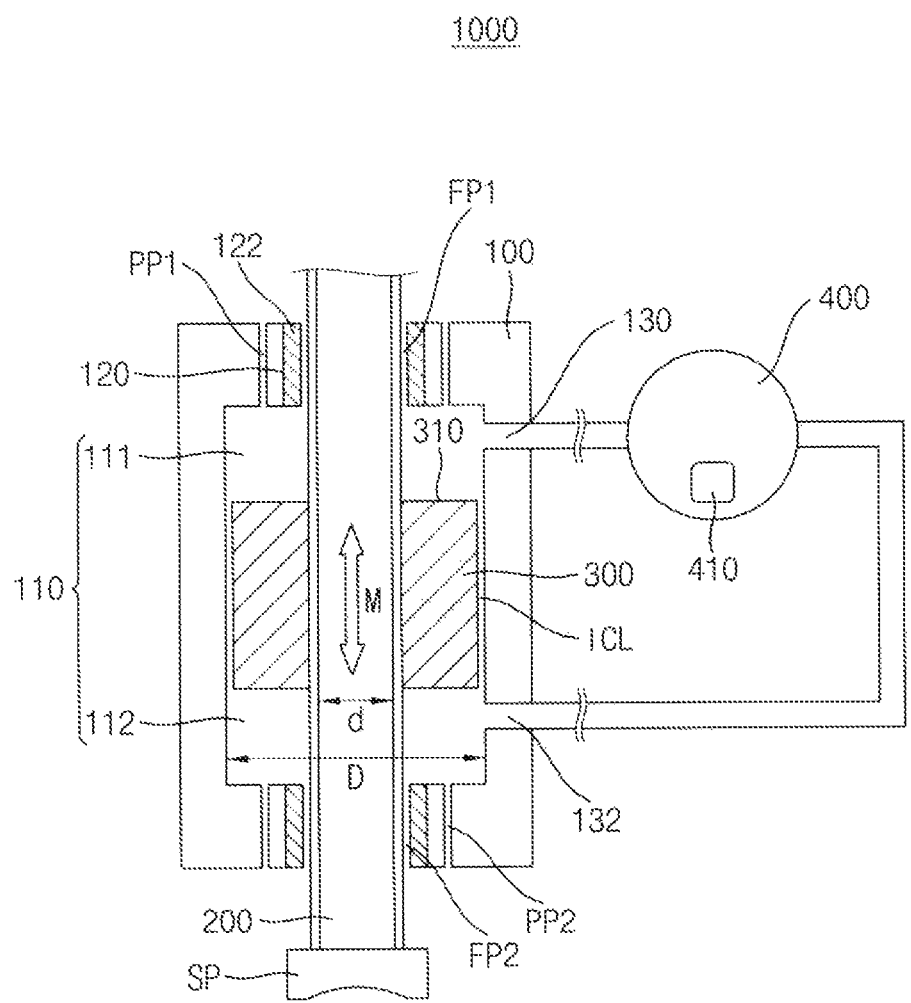
FIG. 2 is a cross-sectional view illustrating a picker assembly apparatus in accordance with another example embodiment.

FIG. 2 is a cross-sectional view illustrating a picker assembly apparatus in accordance with another example embodiment. The picker assembly in FIG. 2 may have substantially the same structures as the picker assembly in FIG. 1, except that first and second penetration paths PP1 and PP2 may be provided with the body 100 as well as the first and the second discharge air lines FP1 and FP2.

As shown in FIG. 2, the first and the second penetration paths PP1 and PP2 may be further arranged at the upper and lower portions of the body 100, respectively, in such a way that the joint holes 120 may be enclosed by the first and the second penetration paths PP1 and PP2.

For example, the first and the second penetration paths PP1 and PP2 may be shaped into a circular slit enclosing the joint hole 120 and the air chamber 110 may be communicated with surroundings through the first and the second penetration paths PP1 and PP2.

Thus, when the overload is applied to the pickup cylinder 200, the compressed air in the air chamber 110 may be discharged outwards through the first and the second penetration paths PP1 and PP2 as well as the first and the second air discharge lines FP1 and FP2. As a result, the amount of the outflow of the compressed air from the air chamber 110 may increase and the response time or the absorption time to the overload may be reduced.

Although not shown in figures, when the tolerance between the pickup cylinder 200 and the bearing 122 are minimized, the compressed air in the air chamber 110 may be discharged just through the first and the second penetration paths PP1 and PP2.

Figure 3:
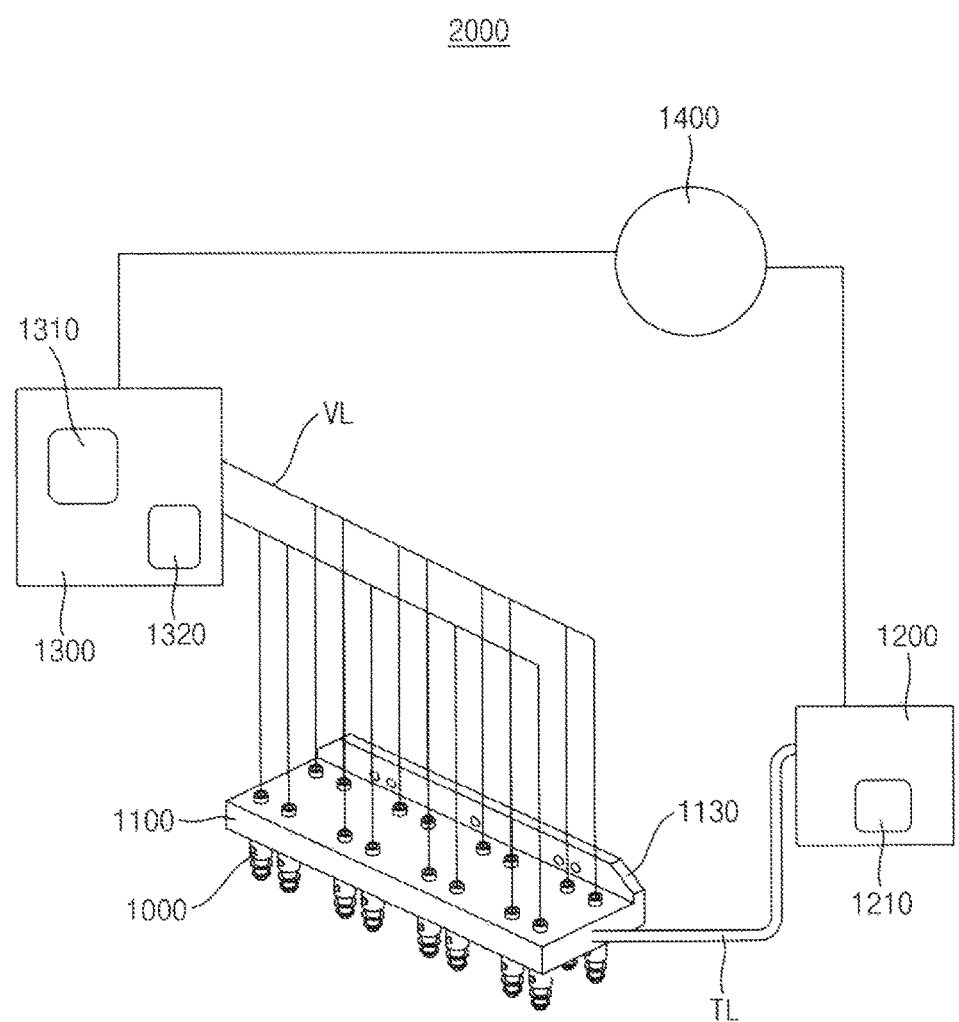
FIG. 3 is a structural view illustrating an exemplary picking apparatus for picking semiconductor devices having the picker assembly shown in FIG. 1, in accordance with an example embodiment.
Figure 4:
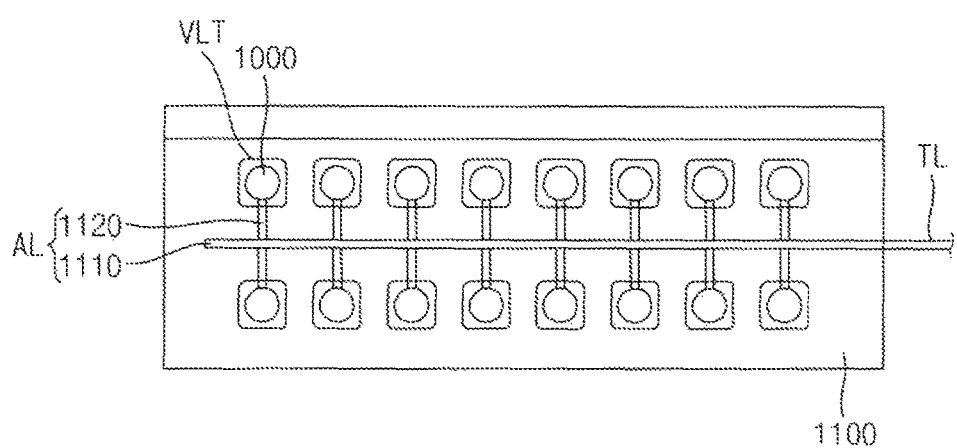
FIG. 4 is a plan view illustrating a base plate of the picking apparatus shown in FIG. 3, according to an example embodiment.

FIG. 3 is a structural view illustrating a picking apparatus for picking semiconductor devices having the picker assembly shown in FIG. 1 according to one example embodiment, and FIG. 4 is a plan view illustrating a base plate of the picking apparatus shown in FIG. 3 according to one example embodiment.

Referring to FIGS. 3 and 4, the picking apparatus 2000 in accordance with an example embodiment may include a base plate 1100 having a single common air line 1110 through which a compressed air is supplied and a plurality of branch air lines 1120 branches from the common air line 1110, a pneumatic center 1200 for controlling the air flow of the compressed air to the common air line 1110, a plurality of picker assemblies 1000 mounted on and/or in the base plate 1100 and connected to the branch air lines 1120, respectively, and a vacuum pressure generator 1300 that applies a vacuum pressure for absorbing the semiconductor devices to each of the picker assemblies 1000.

The base plate 1100 may include, for example, a steel plate having a predetermined thickness and a sufficient strength. A plurality of the picker assemblies 1000 may be arranged on a lower face of the base plate 1100 and a plurality of vacuum lines VL may be connected to the plurality of the picker assemblies 1000 from an upper face of the base plate 1100. The compressed air may be transferred to the base plate 1100 through a transfer line TL from the pneumatic center 1200. The picker assemblies 1000 may individually be described as including housing cylinders, which may house, for example, the picker cylinder 200 described in FIGS. 1 and 2.

In the present example embodiment, the picker assemblies 1000 may be arranged in a matrix shape in such a configuration that an upper portion of each picker assembly 100 may protrude from the upper face of the base plate 1100. The suction pad SP may be provide at a lower portion of each picker assembly 1000 and a vacuum line terminal VLT may be provided at an upper portion of each picker assembly 1000. The vacuum line terminal VLT may be individually connected to the vacuum line VL that may be extended from the vacuum pressure generator 1300.

Each picker assembly 1000 may have the same structures as the picker assembly as described in detail with reference to FIGS. 1 and 2, so any further detailed descriptions on the picker assemblies 1000 will be omitted.

In one embodiment, the vacuum line VL may include a plurality of branch vacuum lines that may be connected to the vacuum line terminals VLT on each picker assembly 1000, respectively, and a pair of common vacuum lines to which the branch vacuum lines may be commonly connected.

When a vacuum pump 1320 is operated in the vacuum pressure generator 1300, the inner space of the pickup cylinder 200 of each picker assembly 1000 may be vacuumized under a predetermined vacuum pressure. Thus, the semiconductor devices may be suctioned and adhered to the suction pad SP by the vacuum pressure.

The vacuum pressure generator 1300 may include a vacuum control terminal 1310 that may be connected to a central controller 1400 of the picking apparatus 2000, so the driving conditions and current states of the picker assemblies 1000 may be detected and displayed in a real time. Thus, the vacuum pressure to the picker assembly 1000 may be controlled in a real time according to the driving conditions and current states of each picker assembly 1000. Typical control hardware and software for controlling the vacuum pressure of picker devices for picking up and dropping semiconductor devices are known and are not further discussed herein.

A plurality of air lines AL may be arranged in the base plate 1100 and the air line AL may be connected to the transfer line TL through which the compressed air may be transferred from the pneumatic center 1200.

The pneumatic center 1200 may include the pneumatic source 400 as described in detail with reference to FIG. 1 and a pneumatic control terminal 1210 that may be connected to the central controller 1400 of the picking apparatus 2000. Since the driving conditions and current states of the picker assemblies 1000 may be detected and displayed on the pneumatic control terminal 1210, the air pressure in the air chamber 110 of each picker assembly 1000 may be accurately controlled according to the driving conditions and current states of each picker assembly 1000. For example, hardware and software components of the pneumatic center 1200 may control when to increase the air pressure in each first chamber 111 and second chamber 112 of each picker assembly 1000, in order to reduce the force exerted on semiconductor devices when picking them up or dropping them off and to may maintain dynamic equilibrium inside the air chambers 110, and/or may control the overall pressure based on different operating scenarios.

The air line AL may include a single common air line 1110 that may be connected to the transfer line TL and the compressed air may be supplied from the pneumatic center 1200 and a plurality of branch air lines 1120 that may branch from the common air line 1110 and may be connected to the air chamber 110 of each picker assembly 1000. Thus, the branch air line 1120 may be connected to the supply lines 130 and 132 of each picker assembly 1000. Otherwise, the branch air line 1120 may be used for supplying the compressed air in place of the supply lines 130 and 132 according to the configurations of the picking apparatus 2000.

The compressed air may be transferred to the common air line 1110 through the transfer line TL from the pneumatic center 1200 and may be supplied to the air chamber 110 of each picker assembly through the respective branch air line 1120. A combine plate 1130 may be provide at a side of the base plate 1100 and the picking apparatus 2000 may be combined to a transfer system (not shown) for transferring the picked semiconductor chips.

When the pickup cylinder 200 of the picker assembly 1000 moves downwards for picking up the semiconductor chips from the chip carrier, an overload may be applied to the suction pad SP or the pickup cylinder 200 due to various defects such as a flatness defect of the chip carrier. In such a case, the overload may be absorbed or taken into the compressed air of the air chamber 110 and the compressed air in the air chamber 110 may be discharged outwards through the first and the second air discharge lines FP1 and FP2. Therefore, the overload to the pickup cylinder 200 may be absorbed or taken into the compressed air in the air chamber 110 and may be prevented from being applied to the semiconductor device, which may reduce or minimize the damage to the semiconductor device due to the overload.

In certain example embodiments, small load changes of about 20 gf to about 25 gf may be sufficiently absorbed or taken into the compressed air of the air chamber 110, so that the semiconductor device may be protected from such a small overload in a range of about 20 gf to about 25 gf.

According to a conventional picker assembly in which the overload is absorbed by a mechanical absorber such as a spring, the overload may be absorbed in proportional to an elastic coefficient of the spring. Thus, when the overload may be so small that the spring cannot detect the overload, the spring cannot absorb the overload and the overload may cause the damages to the semiconductor chips. In addition, when the spring is worn out and the elasticity of the spring is deteriorated, the spring is not compressed and the overload cannot be absorbed into the spring.

However, the picker assembly 1000 of the present example embodiment may include the air chamber 110 in which the pickup cylinder 200 and the power transformer 300 may be float in the compressed air. Thus, a minute external force slightly larger than the inertia of the floated pickup cylinder 200 and the power transformer 300 may be sufficient for breaking the dynamic equilibrium of the compressed air in the air chamber 110, so that the overload to the pickup cylinder 200 may be absorbed into the compressed air in the air chamber 110 much more sensitively than the overload may be absorbed by the spring of the conventional picker assembly. Therefore, the damages to the semiconductor chips caused by the overload may be accurately controlled by changing the sensitivity of the air chamber with respect to the overload.

Figure 5:
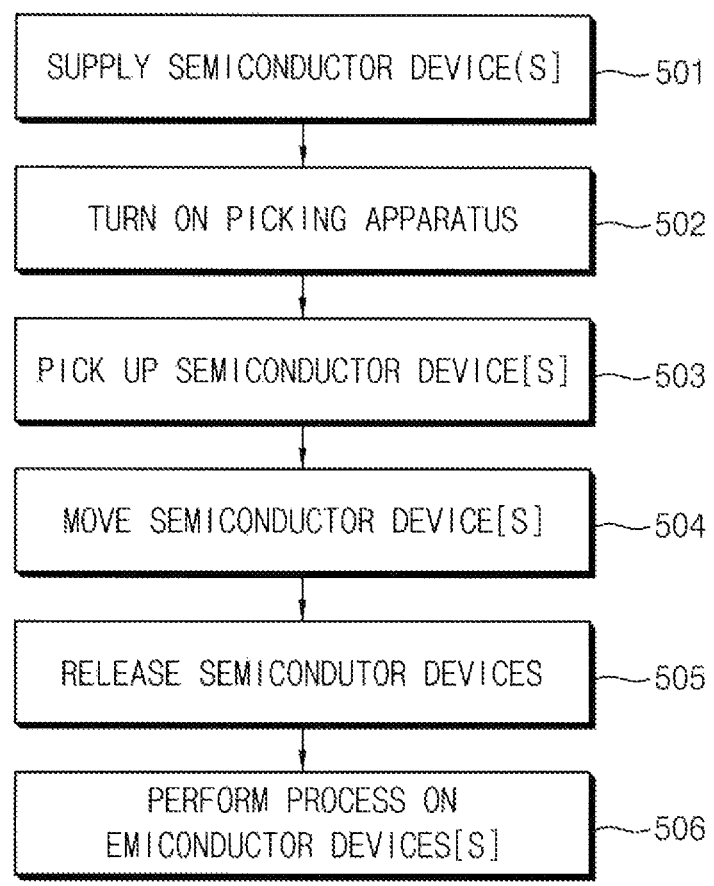
FIG. 5 is a flowchart showing a method of manufacturing a semiconductor device using a picking apparatus and picker assembly, according to an example embodiment.

FIG. 5 shows a method of manufacturing a semiconductor device using a picker assembly apparatus and picking apparatus, according to example embodiments. In step 501, a semiconductor device is supplied in a manufacturing chamber or room, on a tray or other support structure. For example, the semiconductor device may be a single semiconductor chip formed on a die, or a stack of such semiconductor chips, or a semiconductor package. A plurality of semiconductor devices may be supplied simultaneously, for example, in an array, arranged to be picked up by a plurality of picker assembly apparatuses (e.g., picker assembly apparatuses such as shown in FIGS. 1 and 2) attached to a base plate, for example as shown in FIGS. 3 and 4. In step 502, the picking apparatus, such as picking apparatus 2000 shown in FIG. 3 is turned on, or is adjusted (e.g., by a user) for operation. For example, during the turning on or adjustment operation, a pneumatic center 1200 sets a specific air pressure to be exerted into the air chambers of the plurality of picker assemblies 1000, and sets a vacuum pressure to be exerted by the pickup cylinders 200. In one embodiment, the air pressure exerted into the air chambers may cause the air chambers to be in a dynamic equilibrium. In the dynamic equilibrium of the air chamber, the air flow may be controlled by the pneumatic center in such a way that the air may be released from the air chamber substantially the same amount as the air may be introduced into the air chamber and the pickup cylinder may be in a floating state where it is neither rising nor falling. It should be noted that steps 501 and 502 can occur in any order with respect to each other, or at the same time. In step 503, one or a plurality of semiconductor devices in an array are picked up by one or a plurality of respective pickup cylinders 200. When being picked up, air is released from the air chamber to the outside of the picker assembly for each picker assembly picking up a respective semiconductor device. For example, the air may be released as a result of a force exerted on the semiconductor device(s) by the pickup cylinder(s) 200.

In step 504, the semiconductor device(s) may be moved— for example base plate may be moved to a different location and may be positioned over a second tray or other support structure. In step 505, the base plate may be moved so that the semiconductor device(s) are in contact with the second tray or support structure, and the semiconductor device(s) may be released. In step 506, a process may be performed on the semiconductor device(s). For example, the second tray or support may be a package substrate wafer, and the semiconductor device(s) may then be formed into semiconductor packages (e.g., bonded to the substrate wafer, covered with an encapsulant, and singulated into individual semiconductor packages). Or, the second tray or support may be a testing device, and the semiconductor device(s) may be tested before further processing steps are performed. In this manner, a semiconductor device may be manufactured using the picker assembly apparatus and picking apparatus described in connection with FIGS. 1-4.

According to the example embodiments of the picker assembly and the picking apparatus using the same, an air chamber may be provided as an open system in the body that may function as an operation base of the pickup cylinder of the picker assembly and the compressed air may be filled into the air chamber in such a way that the compressed air may be under a dynamic equilibrium state in the air chamber. When the overload is applied to the pickup cylinder, the dynamic equilibrium of the compressed air may be broken and the compressed air may be discharged outwards until the dynamic equilibrium of the compressed air is recovered in the air chamber. Therefore, a minute overload may be sufficiently absorbed into the compressed air in the air chamber, so that the damages to the semiconductor chips caused by the overload are prevented when picking up the semiconductor chips by using the picker assembly.

Particularly, the chip damage caused by a minute and fine overload to the pickup cylinder of the picker assembly may more frequently occur as the thickness of the semiconductor chip decreases and the integration degree of the semiconductor chips increases. Since the pickup cylinder and the power transformer of the picker assembly may float in the compressed air of the air chamber, a minute overload slightly larger than the inertia of the floated pickup cylinder and the power transformer may be sufficient for breaking the dynamic equilibrium in the air chamber. Thus, the overload may be sufficiently absorbed into the compressed air in the air chamber much more sensitively than the overload may be absorbed by the mechanical absorber of the conventional picker assembly. Therefore, damage to the semiconductor chips caused by the overload may be sufficiently prevented when picking up the semiconductor chips by using the picker assembly.

The foregoing is illustrative of example embodiments and is not to be construed as limiting thereof Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An apparatus for picking up one or more semiconductor devices, the apparatus comprising:
   a body having an air chamber that communicates with surroundings outside of the body and a supply line through which compressed air is supplied into the air chamber;
   a pickup cylinder penetrating through the body and movably installed in the body, a suction pad being provided at an end portion of the pickup cylinder; and
   a power transformer secured to the pickup cylinder and transforming an air pressure of the air chamber into a driving force for driving the pickup cylinder,
   wherein the air chamber is shaped into a cylinder having a diameter larger than that of the pickup cylinder, and the power transformer is shaped into a hollow disk through which the pickup cylinder penetrates.

2. The apparatus of claim 1, further comprising a pneumatic source that is connected to the supply line and generates the compressed air.

3. The apparatus of claim 2, wherein the pneumatic source includes a pneumatic controller for changing a moving direction of the pickup cylinder by controlling the air pressure in the air chamber.

4. An apparatus for picking up one or more semiconductor devices, the apparatus comprising:
   a body having an air chamber that communicates with surroundings outside of the body and a supply line through which compressed air is supplied into the air chamber;
   a pickup cylinder penetrating through the body and movably installed in the body, a suction pad being provided at an end portion of the pickup cylinder; and
   a power transformer secured to the pickup cylinder and transforming an air pressure of the air chamber into a driving force for driving the pickup cylinder,
   wherein the power transformer includes a separation plate enclosing the pickup cylinder and having a shape corresponding to a surface profile of an inner sidewall of the air chamber such that the air chamber is separated into a first chamber and a second chamber by the separation plate,
   wherein the power transformer is spaced apart from the inner sidewall of the air chamber and an inter-chamber air line through which the compressed air flows between the first and the second chambers is provided with the air chamber, and
   wherein the body includes a first air discharge line through which compressed air in the first chamber is discharged and a second air discharge line through which compressed air in the second chamber is discharged.

5. The apparatus of claim 4, wherein the body includes a pair of joint holes that are positioned at respective opposite end portions of the body, and are in fluid communication with the air chamber such that the pickup cylinder is movably installed at the joint holes.

6. The apparatus of claim 5,
   wherein the pickup cylinder includes a pair of bearings that are installed at sides of the joint holes and enclose circumferential surfaces of the pickup cylinder at the joint holes, respectively.

7. The apparatus of claim 4, wherein the air chamber is shaped into a cylinder having a diameter larger than that of the pickup cylinder, and the power transformer is shaped into a hollow disk through which the pickup cylinder penetrates.

8. The apparatus of claim 4, wherein the power transformer is spaced apart from the inner sidewall of the air chamber by an amount in the range of 5 µm to 20 µm such that the inter-chamber air line has a width of 5 µm to 20µm.

9. The apparatus of claim 4, wherein the first air discharge line has a width corresponding to an allowable tolerance of the pickup cylinder at an upper portion of the body and the second air discharge line has a width corresponding to the allowable tolerance of the pickup cylinder at a lower portion of the body.

10. The apparatus of claim 4, wherein the body further includes a first penetration path that communicates the first chamber to surroundings and a second penetration path that communicates the second chamber to surroundings.

11. The apparatus of claim 10, wherein the first and the second penetration paths have the same width as the inter-chamber air line.

12. An apparatus for picking up semiconductor devices, comprising:
- a base plate having a common air line through which a compressed air is supplied and a plurality of branch air lines that branch from the common air line;
- a pneumatic center for controlling the air flow of the compressed air to the common air line;
- a plurality of picker assemblies mounted on or in the base plate and connected to the branch air lines, respectively; and
- a vacuum pressure generator that applies a vacuum pressure for suctioning the semiconductor devices to each of the picker assemblies,
- wherein each picker assembly includes:
- a body having an air chamber that communicates with surroundings outside the picker assembly and an air supply line that is connected to a respective branch air line and supplies compressed air to the air chamber;
- a pickup cylinder penetrating through the body and movably installed in the body in such a configuration that a first end portion of the pickup cylinder is connected to the vacuum pressure generator and a second end portion of the pickup cylinder opposite to the first end portion includes a suction pad to which semiconductor devices are suctioned and adhered; and
- a power transformer secured to the pickup cylinder and transforming an air pressure of the air chamber to a driving force for driving the pickup cylinder,
- wherein the power transformer includes a separation plate that separates the air chamber into a first chamber and a second chamber, and
- wherein the body includes a first air discharge line through which compressed air in the first chamber is discharged and a second air discharge line through which compressed air in the second chamber is discharged such that the air chamber is in fluid communication with surroundings through the first air discharge line and the second air discharge line.

13. The apparatus of claim 12, wherein the separation plate encloses the pickup cylinder and has a shape corresponding to a surface profile of an inner sidewall of the air chamber such that the air chamber is separated into the first chamber and the second chamber by the separation plate.

14. The apparatus of claim 13, wherein the power transformer is spaced apart from the inner sidewall of the air chamber and an inter-chamber air line through which the compressed air flows between the first chamber and the second chamber is provided with the air chamber.

15. The apparatus of claim 12, wherein the first air discharge line has a width corresponding to an allowable tolerance of the pickup cylinder at an upper portion of the body and the second air discharge line has a width corresponding to the allowable tolerance of the pickup cylinder at a lower portion of the body.

16. The apparatus of claim 12, wherein the pneumatic center includes a pneumatic controller for changing a moving direction of the pickup cylinder by controlling the air pressure in the air chamber.

17. The apparatus of claim 16, wherein the pneumatic controller is configured to maintain the compressed air in a dynamic equilibrium in the air chamber in such a condition that the dynamic equilibrium is broken by a load change in a range of 20gf to 25gf.

* * * * *